United States Patent
Kawasaki et al.

(10) Patent No.: US 7,407,864 B2
(45) Date of Patent: Aug. 5, 2008

(54) POLYSILAZANE PERHYDRIDE SOLUTION AND METHOD OF MANUFACTURING A SEMICONDUCTOR DEVICE USING THE SAME

(75) Inventors: Atsuko Kawasaki, Yokohama (JP); Masahiro Kiyotoshi, Sagamihara (JP); Keisuke Nakazawa, Yokohama (JP); Osamu Arisumi, Yokohama (JP); Takeshi Hoshi, Yokohama (JP); Katsuhiko Tachibana, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 316 days.

(21) Appl. No.: 11/175,305

(22) Filed: Jul. 7, 2005

(65) Prior Publication Data
US 2006/0205165 A1 Sep. 14, 2006

(30) Foreign Application Priority Data
Mar. 9, 2005 (JP) ............................. 2005-065811

(51) Int. Cl.
H01L 21/76 (2006.01)
(52) U.S. Cl. ...................... 438/424; 438/296
(58) Field of Classification Search ............... 438/424, 438/296
See application file for complete search history.

(56) References Cited

U.S. PATENT DOCUMENTS

| 6,057,580 | A | * | 5/2000 | Watanabe et al. | ........... 257/396 |
| 6,191,002 | B1 | * | 2/2001 | Koyanagi | .................... 438/431 |
| 2004/0266131 | A1 | | 12/2004 | Kawasaki et al. | |

FOREIGN PATENT DOCUMENTS

JP 3479648 10/2003

\* cited by examiner

*Primary Examiner*—Carl Whitehead, Jr.
*Assistant Examiner*—Sonya D McCall Shepard
(74) *Attorney, Agent, or Firm*—Finnegan, Henderson, Farabow, Garrett & Dunner, L.L.P.

(57) ABSTRACT

Disclosed is a method of manufacturing a semiconductor device comprising forming an element isolation trench in a semiconductor substrate, coating a polysilazane perhydride solution on the semiconductor substrate having the element isolation trench formed thereon to form a polysilazane perhydride film, the polysilazane perhydride solution comprising dibutyl ether having a butanol concentration of 30 ppm or less, and polysilazane perhydride dissolved in the dibutyl ether, subjecting the polysilazane perhydride film to oxidation in an atmosphere containing water vapor to form a silicon dioxide film, and selectively removing the silicon dioxide film to leave the silicon dioxide film in the element isolation trench to form an element isolating insulation film.

19 Claims, 6 Drawing Sheets

POLYSILAZANE PERHYDRIDE SOLUTION AND METHOD OF MANUFACTURING A SEMICONDUCTOR DEVICE USING THE SAME

CROSS-REFERENCE TO RELATED APPLICATIONS

This application is based upon and claims the benefit of priority from prior Japanese Patent Application No. 2005-065811, filed Mar. 9, 2005, the entire contents of which are incorporated herein by reference.

BACKGROUND OF THE INVENTION

1. Field of the Invention

This invention relates to a polysilazane perhydride solution and a method for manufacturing a semiconductor device by using a polysilazane perhydride solution.

2. Description of the Related Art

An isolation structure known as an STI (Shallow Trench Isolation) structure is extensively employed for the isolation of elements in a semiconductor device. This STI structure can be created by a method wherein a trench is formed in an element isolation region of a semiconductor substrate, and then, a silicon oxide ($SiO_2$) film functioning as an element isolating insulation film is buried inside this trench to form this STI structure. Recently however, due to the increase in aspect ratio of the trench for meeting demands for enhancing the fineness of semiconductor elements, it is now becoming increasingly difficult to bury the conventional ozone ($O_3$)-TEOS CVD-$SiO_2$ film or HDP CVD-$SiO_2$ film in the trench of STI structure without causing the generation of voids or a seam.

Therefore, in the manufacture of a semiconductor device where the fineness of semiconductor elements is in the order of 100 nm or less, it has been proposed to fill the STI trench with an element isolating insulation film by using a coating type solution SOG (Spin-On-Glass). As for the SOG solution, a chemical comprising silicon hydroxide (silanol: $SiOH_4$) dissolved in an organic solvent such as alcohol is generally employed. This silicon hydroxide solution is coated on a substrate to form a coated film, which is then heat-treated. Due to this heat treatment, the hydrolysis and dehydrocondensation reaction of silanol generate, thereby converting the coated film of silicon hydroxide solution into a silicon dioxide film. On the occasion of the hydrolysis and dehydrocondensation reaction of silanol however, a large magnitude of volumetric shrinkage generated in the coated film, resulting in the generation of cracks in the silicon dioxide film filled in the STI trench.

Under the circumstances, a polysilazane perhydride solution which is relatively low in volumetric shrinkage is noticed as useful for the SOG type chemical in recent years.

BRIEF SUMMARY OF THE INVENTION

A polysilazane perhydride solution according to one aspect of the present invention comprises dibutyl ether having a butanol concentration of 30 ppm or less; and polysilazane perhydride dissolved in the dibutyl ether.

A method of manufacturing a semiconductor device according to another aspect of the present invention comprises forming an element isolation trench in a semiconductor substrate; coating a polysilazane perhydride solution on the semiconductor substrate having the element isolation trench to form a polysilazane perhydride film, the polysilazane perhydride solution comprising dibutyl ether having a butanol concentration of 30 ppm or less, and polysilazane perhydride dissolved in the dibutyl ether; subjecting the polysilazane perhydride film to oxidation in an atmosphere containing water vapor to form a silicon dioxide film; and selectively removing the silicon dioxide film to leave the silicon dioxide film in the element isolation trench, thereby forming an element isolating insulation film.

A method of manufacturing a semiconductor device according to another aspect of the present invention comprises successively forming a gate insulating film, a first gate electrode film and a stopper film above a semiconductor substrate; forming an element isolation trench in the semiconductor substrate having the gate insulating film, the first gate electrode film and the stopper film; coating a polysilazane perhydride solution above the semiconductor substrate having the element isolation trench to form a polysilazane perhydride film, the polysilazane perhydride solution comprising dibutyl ether having a butanol concentration of 30 ppm or less, and polysilazane perhydride dissolved in the dibutyl ether; subjecting the polysilazane perhydride film to oxidation in an atmosphere containing water vapor to form a silicon dioxide film; selectively removing the silicon dioxide film deposited on the stopper film to leave the silicon dioxide film in the element isolation trench, thereby forming an element isolating insulation film; removing the stopper film to expose a surface of the first gate electrode film; removing an upper portion of the element isolating insulation film to expose an upper portion of side of the first gate electrode film; and forming a second gate electrode film, via an inter-electrode insulating film, over the first gate electrode film having an upper portion of side thereof being exposed and over the element isolating insulation film having an upper portion thereof being removed.

DETAILED DESCRIPTION OF THE INVENTION

Next, the embodiments of the present invention will be explained as follows.

With a view to form an element isolation film in an STI trench by using a polysilazane perhydride solution to manufacture a semiconductor device excellent in element isolation properties, the present inventors have created a silicon dioxide film at first by using polysilazane perhydride solution and studied the properties of this silicon dioxide film.

More specifically, polysilazane perhydride was dissolved in dibutyl ether solvent to form a polysilazane perhydride solution, which was then coated on a substrate by a spin-coating method. The substrate having the coated layer was placed on a hot plate and baked for 3 minutes at a temperature of 150° C. to volatilize and remove the dibutyl ether, thereby forming a polysilazane perhydride film (PSZ film) having a thickness of 500 nm. Then, the measurement of SIMS was conducted on this PSZ film, the results thus obtained being illustrated in the graph of FIG. 1.

Figure 1:
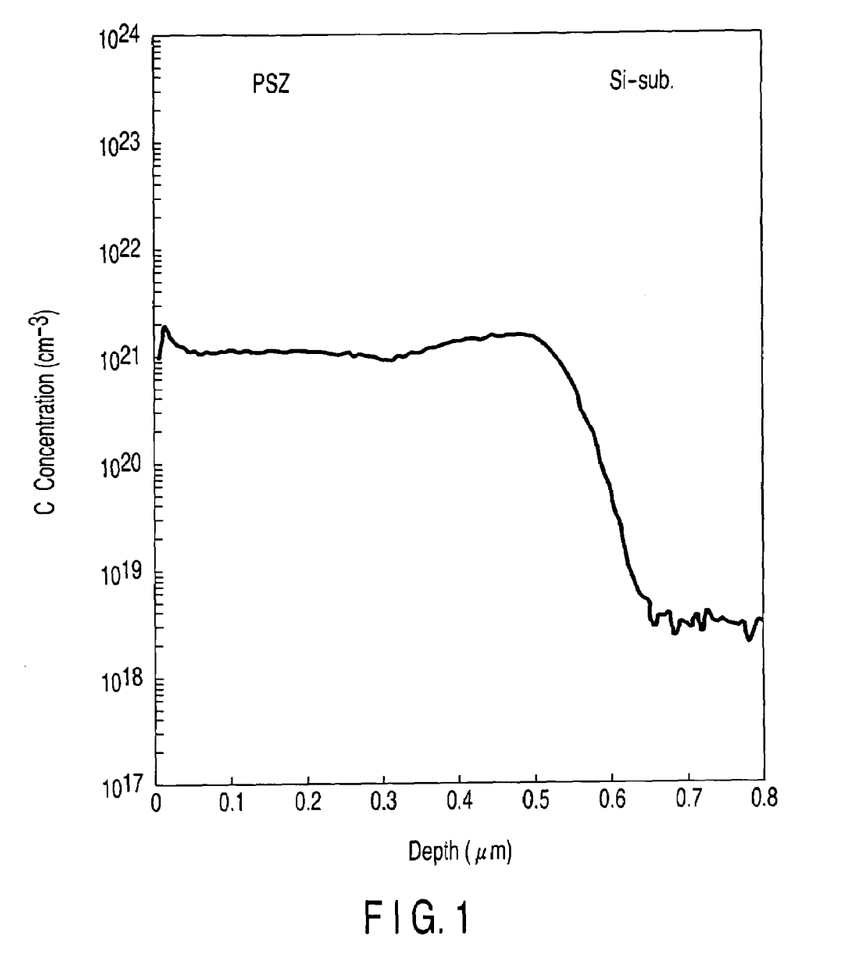
FIG. 1 is a graph illustrating a depth-wise distribution (SIMS) of the concentration of carbon (C) in the polysilazane perhydride film.

It will be seen from the results that the polysilazane perhydride film contained a large quantity of carbon (C), i.e. of the order of $1 \times 10^{21}$ ($cm^{-3}$). The polysilazane perhydride employed herein comprises a repeating unit represented by a formula of —($SiH_2NH$)— and which contains no oxygen atoms. In order to form an element isolating insulation film buried in the STI trench, it is required that the polysilazane perhydride film be subjected to an oxidation treatment to convert it into silicon dioxide ($SiO_2$).

Figure 2:
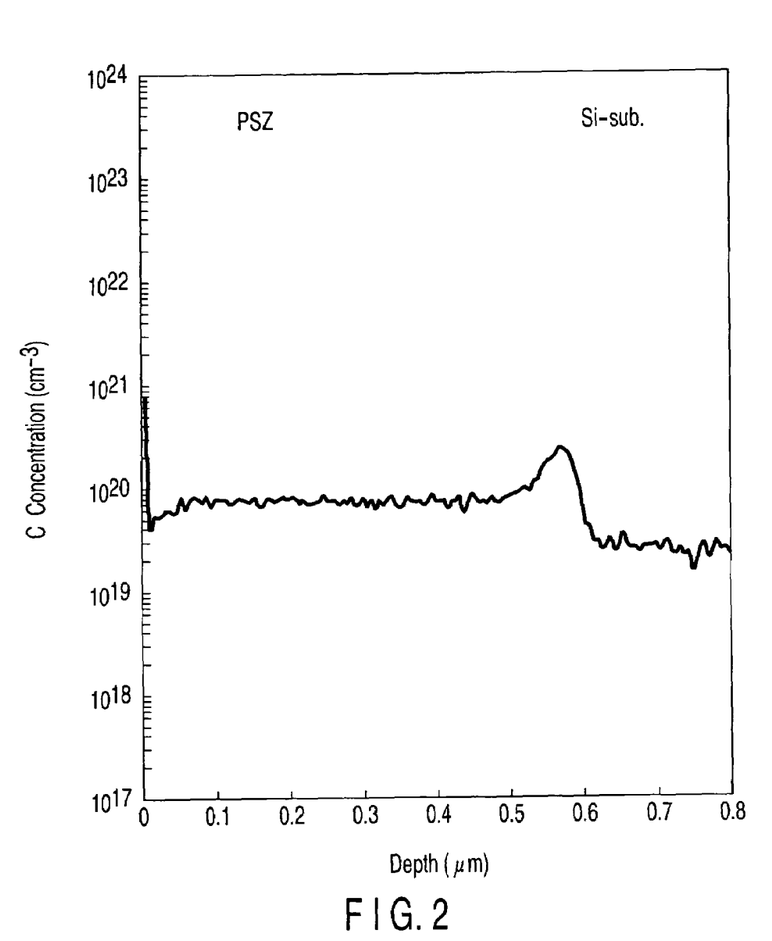
FIG. 2 is a graph illustrating a depth-wise distribution (SIMS) of the concentration of carbon (C) in the silicon dioxide film which was obtained through the oxidation of the polysilazane perhydride film.

Herein, the polysilazane perhydride film was subjected to an oxidation treatment for 15 minutes in an atmosphere containing water vapor at a temperature of 400° C. to convert the polysilazane perhydride film into a silicon dioxide film. The SIMS measurement was conducted on this silicon dioxide film to obtain the results shown in the graph of FIG. 2. It will be clear from FIG. 2 that even after the oxidation treatment, carbon in an amount of about $8 \times 10^{19}$ ($cm^{-3}$) remained in the silicon dioxide film.

Figure 3:
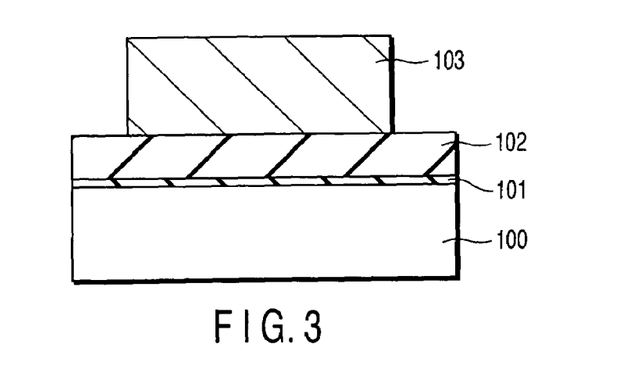
FIG. 3 shows a cross-sectional view of a sample employed for the measurement of Vfb.

Then, the measurement of the flat band was conducted on the silicon dioxide film obtained using the polysilazane perhydride solution. FIG. 3 shows a cross-sectional view of the sample employed for the measurement of the flat band. First of all, a thermal oxide film 101 having a thickness of 10 nm was formed on a silicon substrate 100 and then, a polysilazane perhydride solution was coated on the thermal oxide film 101 by a spin-coating method to obtain a polysilazane perhydride film having a thickness of 750 nm. Thereafter, the polysilazane perhydride film was subjected to oxidation treatment for 15 minutes at a temperature of 400° C. in an atmosphere containing water vapor. As a result, the polysilazane perhydride film was shrunk by about 20% and converted into a silicon dioxide film 102 having a thickness of about 600 nm. On this silicon dioxide film 102 was deposited a polycrystalline silicon film having a thickness of 150 nm, which was then subjected to a patterning process to form an electrode 103 having an area of 10 $mm^2$. A first sample was obtained by going through the aforementioned steps.

Further, a second sample was obtained by following the same steps described above except that the film thickness of the polysilazane perhydride film was altered to 500 nm. In this case, the film thickness of the silicon dioxide film 102 was about 400 nm.

For the purpose of comparison, a third sample was manufactured by following the same steps described above except that the silicon dioxide film 102 having a film thickness of 400 nm was deposited by CVD-HDP method.

In the sample shown in FIG. 3, when an electric voltage was applied to the electrode 103, a positive or negative electric charge was induced at the surface of the silicon substrate 100. The surface spatial charge density Qs thereof can be represented by a function of the surface potential $\Phi s$. When this surface potential was zero, i.e. $\Phi s=0$, it will be referred to as a flat band state and an electric voltage applied to realize this flat band state is a flat band voltage (Vfb). In an ideal MOS structure, the flat band voltage thereof is zero, i.e. Vfb=0. In an actual MOS structure however, an electric charge exists in the oxide film 101 and an interface potential exists at the interface between the oxide film 101 and the silicon substrate 100. Therefore, Vfb would not be zero.

Figure 4:
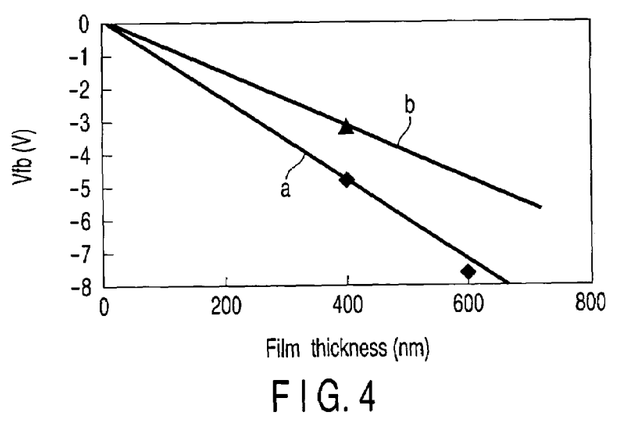
FIG. 4 is a graph illustrating a relationship between the film thickness of the silicon dioxide film and Vfb.

When the measurement of Vfb was conducted on three samples, i.e. the first sample, the second sample and the third sample, the Vfb was −7.6V in the first sample, −4.8V in the second sample, and −3.2V in the third sample. The graph of FIG. 4 illustrates the results of Vfb values thus obtained, which are plotted relative to the film thickness of the silicon dioxide film 102. In FIG. 4, the straight lines "a" and "b" are drawn from the origin so as to make these lines pass through the plotted points. The straight line "a" represents the results obtained from the silicon dioxide film which was formed through the employment of a polysilazane perhydride solution. The straight line "b" represents the results obtained from the silicon dioxide film which was formed by the CVD-HDP.

It will be recognized from the comparison between the straight line "b" and the straight line "a" that the silicon dioxide films (the first and second samples) which were formed through the oxidation of a polysilazane perhydride film exhibited Vfb values which were deviated much more negativity than those of the silicon dioxide film (the third sample) which was formed by CVD-HDP. Since there were employed Si substrates 100 having the same thermal oxide film 101 formed thereon, it was considered that this difference did not originate from the interface potential. Thus it was suggested that the amount of positive electric charge in the silicon dioxide films formed through the oxidation of a polysilazane perhydride film was higher than that in the HDP oxide film.

When a silicon dioxide film containing electric charge is employed as a burying material for the STI, there is a high possibility that the element isolating properties may be degraded. In order to avoid this, when a silicon dioxide film which has been formed through the oxidation of a polysilazane perhydride film is to be employed as a burying material for the STI, the silicon dioxide film is required to exhibit a Vfb value which is equivalent to that of the HDP oxide film. If a silicon dioxide film having a film thickness of 600 nm is assumed as a criterion, the value of Vfb is required to be −5(V) or more.

Figure 5:
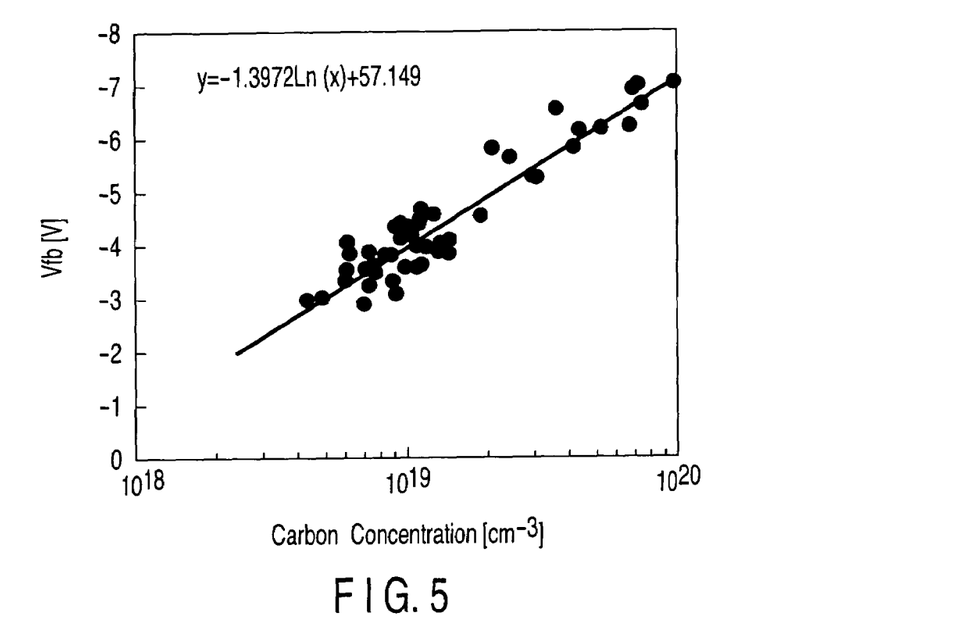
FIG. 5 is a graph illustrating a relationship between the concentration of carbon in the silicon dioxide film and Vfb.

Then, by changing the oxidation conditions of polysilazane perhydride film, various silicon dioxide films were formed. On each of these silicon dioxide films, the concentration of carbon and Vfb was measured in the same manner as described above, the results thus obtained being illustrated in the graph of FIG. 5. Namely, there was a strong correlation between the concentration of carbon and the Vfb value. For example, when the concentration of carbon in the silicon dioxide film is $2 \times 10^{19}$ (cm$^{-3}$) or less, it is possible to obtain a Vfb value of −5(V) or more.

Extensive studies were made by the present inventors on the cause behind carbon existing in the silicon dioxide film which was obtained through the oxidation of polysilazane perhydride film. As a result, the present inventors have noticed that dibutyl ether (DBE) may be employed as a solvent for the polysilazane perhydride solution. Dibutyl ether can be represented by $C_4H_9$—O—$C_4H_9$ and can be synthesized through the dehydrocondensation reaction between molecules of butanol ($C_4H_9OH$; BuOH). Since this condensation reaction is reversible, a minute amount of $C_4H_9OH$ released, as an unavoidable impurity, into dibutyl ether.

Figure 6:
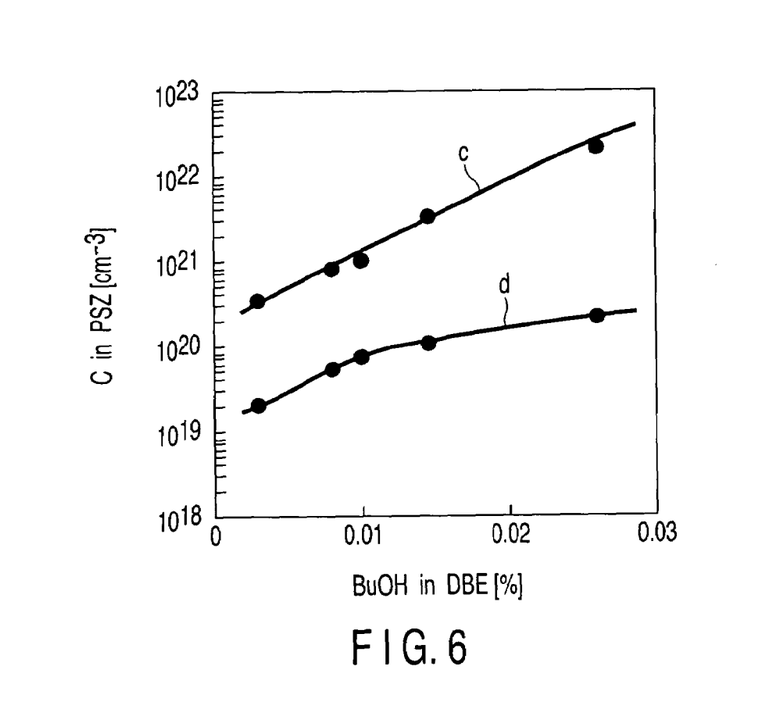
FIG. 6 is a graph illustrating a relationship between the concentration of butanol in dibutyl ether and the concentration of carbon in the silicon dioxide film.

With a view to investigate the influence of the concentration of carbon which originates from butanol, various polysilazane perhydride solution were prepared by using dibutyl ether as a solvent and by changing the concentration of butanol. Then, each polysilazane perhydride solution was coated on a Si substrate by spin coating and baked for three minutes at a temperature of 150° C. by using a hot plate, thereby preparing a polysilazane perhydride film. Thereafter, the concentration of carbon in each polysilazane perhydride film was conducted by SIMS, the results thus obtained being denoted as a curve "c" in the graph of FIG. 6. It will be recognized from the curve "c" that there was a correlation between the concentration of impurity butanol in the dibutyl ether and the concentration of carbon in the polysilazane perhydride film.

This polysilazane perhydride film was then subjected to oxidation treatment in an atmosphere containing water vapor for 15 minutes at a temperature of 400° C. to convert it into a silicon dioxide film. Then, the concentration of carbon in this silicon dioxide film was measured by SIMS, the results thus obtained being denoted as a curve "d" in the graph of FIG. 6. It will be clear from the comparison between the curve "d" and the curve "c" that it was possible to decrease the concentration of carbon in the film by subjecting to oxidation treatment. As already explained with reference to the graph of FIG. 5, in order to confine the value of Vfb within a desired range, the concentration of carbon in the silicon dioxide film is required to be suppressed to $2 \times 10^{19}$ (cm$^{-3}$) or less. It will be clear from the curve "d" that if the concentration of butanol in the dibutyl ether is confined to 30 ppm or less, the value of Vfb can be confined within a desired range.

Based on the aforementioned results, it has been confirmed by the present inventors that a silicon dioxide film to be formed using a polysilazane perhydride solution where dibutyl ether having a butanol concentration of 30 ppm or less is employed as a solvent is optimum for creating the element isolating insulation film of an STI structure. Therefore, in the embodiments of the present invention, a polysilazane perhydride solution comprising dibutyl ether having a butanol concentration of 30 ppm or less was employed as a solvent in the fabrication of the STI structure and in the manufacture of a semiconductor device of a NAND structure.

Embodiment 1

This embodiment illustrates one example of a burying method for STI, which will be explained with reference to FIGS. 7 to 10.

Figure 7:
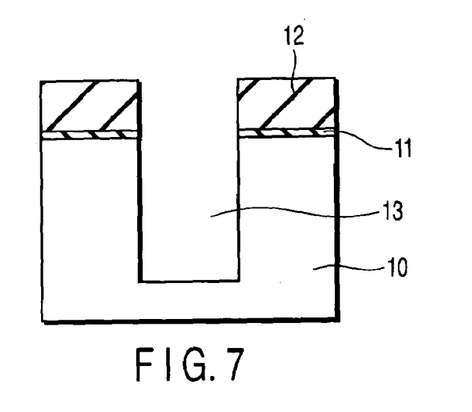
FIG. 7 shows a cross-sectional view illustrating a step in the STI-burying method according to one embodiment of the present invention.

First of all, a silicon dioxide film (about 10 nm in thickness) 11 was formed on a silicon substrate 10 by thermal oxidation. Then, by a vacuum CVD method, a silicon nitride film (about 200 nm in thickness) 12 was formed, as a CMP stopper film, on the silicon dioxide film 11. The film thickness of the film to be formed on the substrate may be altered. For example, the film thickness of the CMP stopper film 12 may be varied within the range of about 100-300 nm.

By photolithography and a dry etching method, an element isolation trench (STI trench) 13 was formed so as to enable the STI trench 13 to pass through the CMP stopper film 12 and the silicon dioxide film 11 and to reach the silicon substrate 10 as shown in FIG. 7. Herein, the configuration of the STI trench 13 was 100 nm in width and 500 nm in depth. However, the width and depth of the STI trench 13 may be varied. For example, the width of the STI trench 13 may be varied within the range of 30 nm to 10 μm, and the depth thereof may be determined within the range of 200 nm to 500 nm.

Figure 8:
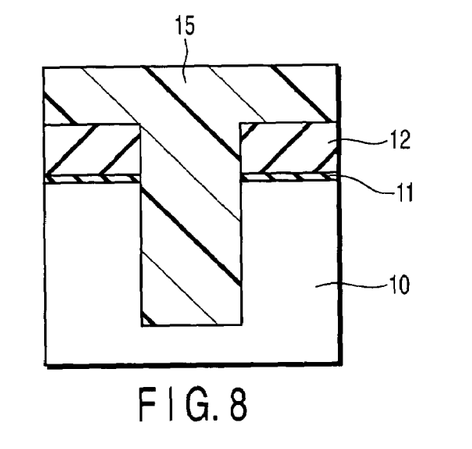
FIG. 8 is a cross-sectional view illustrating a step following the step shown in FIG. 7.

Then, a polysilazane perhydride solution comprising dibutyl ether having a butanol impurity concentration of 30 ppm or less was employed as a solvent was coated on the entire surface of the Si substrate 10 by a spin coating method to form a coated film. Incidentally, prior to forming this coated film, another film, such as a silicon dioxide film, may be deposited on the silicon nitride film 12. The resultant coated layer was placed over a hot plate and baked for 3 minutes at a temperature of 150° C. to volatilize and remove the solvent from the coated film, thereby forming a polysilazane perhydride film 15 as shown in FIG. 8.

Figure 9:
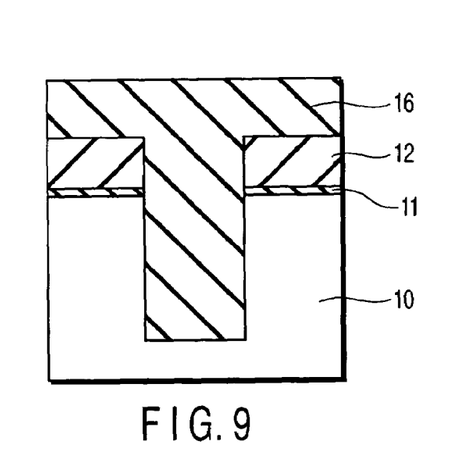
FIG. 9 is a cross-sectional view illustrating a step following the step shown in FIG. 8.

Then, the polysilazane perhydride film 15 was subjected to an oxidation treatment in an atmosphere containing water vapor to convert the polysilazane perhydride film 15 into a silicon dioxide film 16 as shown in FIG. 9. This oxidation treatment may be performed at a temperature confined within the range of 230° C. to 900° C. for instance. If the temperature is lower than 230° C., the silicon dioxide film to be obtained through the oxidation treatment of the polysilazane perhydride film would become very porous, so that the silicon dioxide film can be easily etched away by a solution containing hydrofluoric acid, thus making it difficult to form an element isolating insulation film having a desired height. On the other hand, if the oxidation is performed in an atmosphere containing water vapor at a temperature higher than 900° C., the side of the STI trench 13 would be oxidized thickly. In the worst case, dislocation may generate in the Si substrate 10, thus making it unsuitable as a method for forming the STI of a device of 100 nm class design rule.

Further, in order to stabilize the atmosphere and temperature inside a furnace, the oxidation time should preferably be five minutes or more. However, if the oxidation treatment is performed for an excessively long time, the side of the STI trench 13 may be oxidized thickly. Therefore, the upper limit of the oxidation time should preferably be confined to about 60 minutes.

Herein, the oxidation treatment was performed for 15 minutes at a temperature of 400° C., thereby converting the polysilazane perhydride film 15 into the silicon dioxide film 16.

Figure 10:
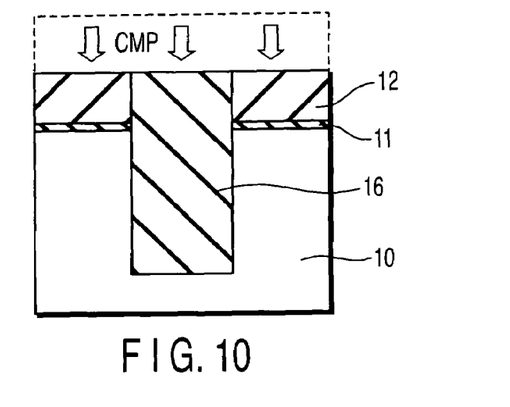
FIG. 10 is a cross-sectional view illustrating a step following the step shown in FIG. 9.

Subsequently, by CMP, the silicon dioxide film 16 was selectively removed to expose the surface of the CMP stopper film 12 as shown in FIG. 10, thereby leaving the silicon dioxide film 16 in the STI trench 13. As a result of these steps, it was possible to bury the element isolating insulation film in the STI trench 13.

According to this embodiment, since a silicon dioxide film was formed by using a polysilazane perhydride solution where dibutyl ether having a butanol impurity concentration of 30 ppm or less was employed as a solvent, the concentration of the carbon (C) remaining in this silicon dioxide film was reduced to $2 \times 10^{19}$ (cm$^{-3}$) or less.

As described above, since the silicon dioxide film 16 reduced in concentration of residual carbon in this manner was buried as an element isolating insulation film in the STI trench, it was possible, according to this embodiment, to manufacture a device excellent in element isolation properties.

Embodiment 2

In the same manner as described in the aforementioned Embodiment 1, a silicon dioxide film 16 was formed on an Si substrate 10 having a silicon dioxide film 11 and a CMP stopper film 12 formed thereon and also having an STI trench 13 formed thereon as shown in FIG. 9. These films were formed using the same materials as described in Embodiment 1, the film thickness of these films also being the same as described in Embodiment 1.

In this embodiment, the silicon dioxide film 16 was densified prior to the step of CMP. The densification of the silicon dioxide film 16 can be performed through the heat treatment thereof in an inert gas atmosphere at a temperature ranging from 700° C. to 1100° C. If the temperature of this heat treatment is lower than 700° C., it would become difficult to sufficiently densify the silicon dioxide film 16. On the other hand, if the temperature of this heat treatment is higher than 1100° C., the diffusion depth of the channel layer formed in advance through the ion implantation may be enlarged depending on the specification of device. The time period of this heat treatment may be optionally selected from the range of one second to 120 minutes. When the heat treatment is conducted under these conditions, water in the silicon dioxide film 16 can be removed, thus densifying the silicon dioxide film 16.

Figure 11:
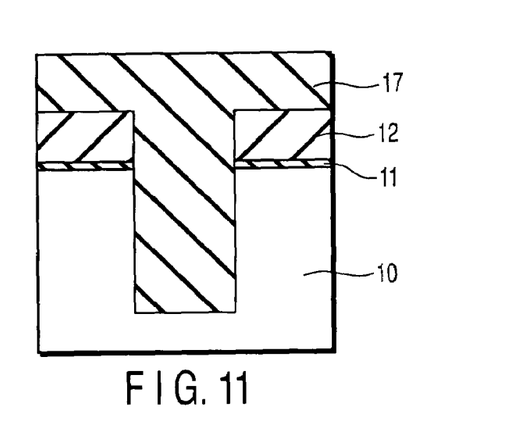
FIG. 11 shows a cross-sectional view illustrating a step in the STI-burying method according to another embodiment of the present invention.

Herein, the heat treatment of the silicon dioxide film 16 was performed for 30 minutes at a temperature of 900° C., thereby transforming the silicon dioxide film 16 into a densified silicon dioxide film 17 as shown in FIG. 11.

Figure 12:
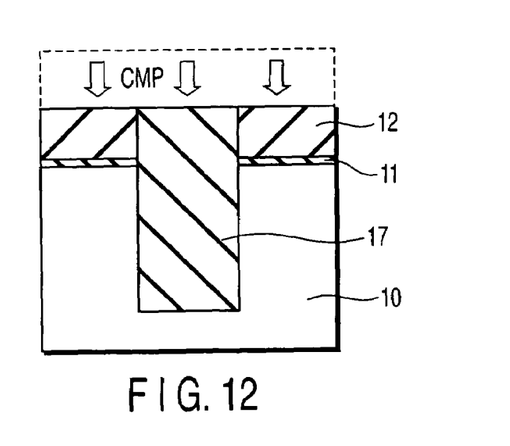
FIG. 12 is a cross-sectional view illustrating a step following the step shown in FIG. 11.
Figure 13:
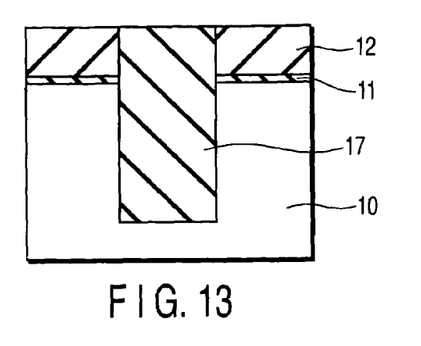
FIG. 13 is a cross-sectional view illustrating a step following the step shown in FIG. 12.

Subsequently, by CMP, the densified silicon dioxide film 17 was selectively removed to expose the surface of the CMP stopper film 12 as shown in FIG. 12, thereby leaving the densified silicon dioxide film 17 in the STI trench 13 as shown in FIG. 13.

According to this embodiment, since a silicon dioxide film was formed by using a polysilazane perhydride solution where dibutyl ether having a butanol impurity concentration of 30 ppm or less was employed as a solvent, the concentration of the carbon (C) remaining in this silicon dioxide film was reduced to $2 \times 10^{19}$ (cm$^{-3}$) or less. Moreover, since the silicon dioxide film was densified, it was possible to advantageously suppress the wet etching rate.

As described above, since the densified silicon dioxide film 17 reduced in concentration of residual carbon in this manner was buried as an element isolating insulation film in the STI trench, it was possible, according to this embodiment, to manufacture a device excellent in element isolation properties.

Embodiment 3

The densification of the silicon dioxide film 16 set forth in the above Embodiment 2 can be performed after the step of burying the silicon dioxide film 16 in the STI trench 13. In this embodiment, in the same manner as described in Embodiment 1, the silicon dioxide film 16 was buried in the STI trench 13 of the Si substrate 10 having a silicon dioxide film 11 and a CMP stopper film 12 formed thereon as shown in FIG. 10. Since the silicon dioxide film 16 was subjected to CMP prior to the densification thereof, the absolute quantity of polysilazane perhydride film was smaller than that of Embodiment 2 and hence the quantity of residual carbon was also smaller as compared with that of Embodiment 2. As a result, it would be advantageous in the respect that the properties of a device would hardly be deteriorated by the densification.

Then, the heat treatment was performed under the same conditions as in Embodiment 2 to densify the silicon dioxide film 16. As a result, it was possible to fill the STI trench 13 with the densified silicon dioxide film 17 as shown in FIG. 13.

According to this embodiment, since a silicon dioxide film was formed by using a polysilazane perhydride solution where dibutyl ether having a butanol impurity concentration of 30 ppm or less was employed as a solvent, the concentration of the carbon (C) remaining in this silicon dioxide film was reduced to $2 \times 10^{19}$ (cm$^{-3}$) or less. Moreover, since the silicon dioxide film was densified, it was possible to advantageously suppress the wet etching rate.

As described above, since the densified silicon dioxide film 17 reduced in concentration of residual carbon in this manner was buried as an element isolating insulation film in the STI trench, it was possible, according to this embodiment, to manufacture a device excellent in element isolation properties.

Embodiment 4

This embodiment will be explained with reference to FIGS. 14 to 18.

Figure 14:
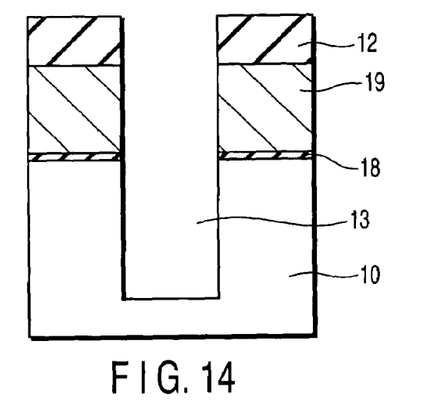
FIG. 14 shows a cross-sectional view illustrating a step in the manufacturing method of a semiconductor device according to a further embodiment of the present invention.

First of all, a gate insulation film (8 nm or less in thickness) 18 was formed on a silicon substrate 10 by thermal oxidation. Then, a polycrystalline silicon film having a thickness of 100 nm was formed, as a first gate (floating gate) electrode film 19, on the gate insulation film 18. As for the first gate electrode film 19, it is also possible to employ WSi, CoSi, etc. other than polycrystalline silicon. The film thickness of the first gate electrode film 19 may be optionally selected from the range of 100 nm to 200 nm. A silicon nitride film (about 200 nm in thickness) was formed, as a CMP stopper film 12, on the first gate electrode film 19 by a vacuum CVD method. As for the CMP stopper film 12, it is also possible to form a polycrystalline silicon film having a film thickness of about 100 nm to 200 nm substituting for the silicon nitride film.

By photolithography and a dry etching method, a STI trench 13 was formed so as to enable the STI trench 13 to pass through the CMP stopper film 12, the first gate electrode film 19 and the gate insulation film 18 and to reach the silicon substrate 10 as shown in FIG. 14. Herein, the configuration of the STI trench 13 was 100 nm in width and 500 nm in depth. However, the width and depth of the STI trench 13 may be varied. For example, the width of the STI trench 13 may be varied within the range of 30 nm to 10 μm, and the depth thereof may be optionally determined within the range of 200 nm to 500 nm.

Figure 15:
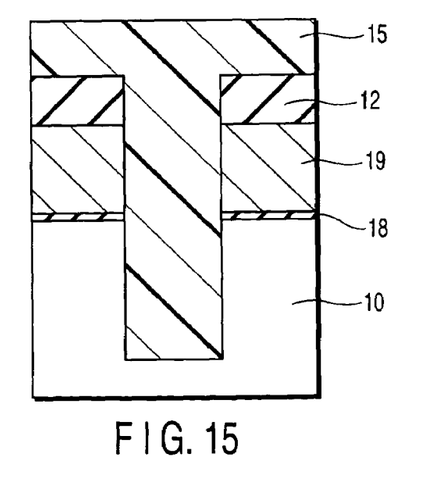
FIG. 15 is a cross-sectional view illustrating a step following the step shown in FIG. 14.
Figure 16:
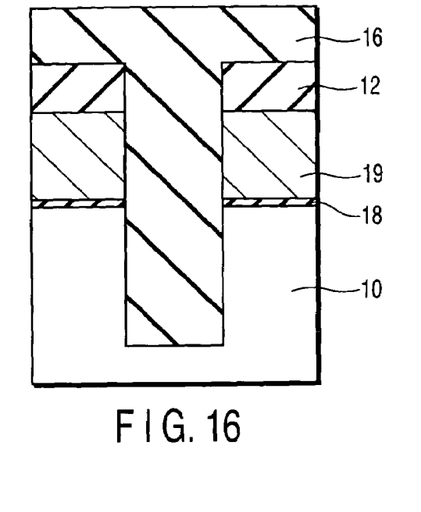
FIG. 16 is a cross-sectional view illustrating a step following the step shown in FIG. 15.

Then, by using a polysilazane perhydride solution and in the same manner as in Embodiment 1, a polysilazane perhydride film 15 was formed as shown in FIG. 15 and then subjected to an oxidation treatment in an atmosphere containing water vapor to convert the polysilazane perhydride film 15 into a silicon dioxide film 16 as shown in FIG. 16.

Figure 17:
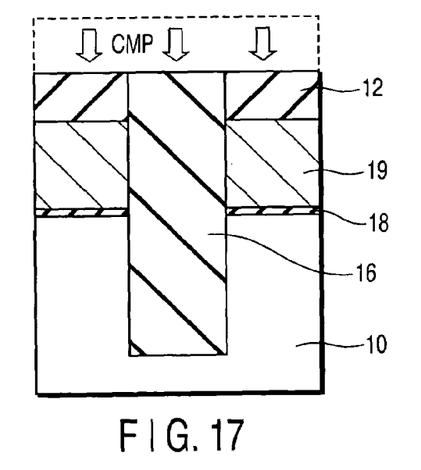
FIG. 17 is a cross-sectional view illustrating a step following the step shown in FIG. 16.

Because of the reasons as explained above, this oxidation treatment should preferably be performed at a temperature ranging from 230° C. to 900° C. for a period of five minutes or more. Further, by CMP, the silicon dioxide film 16 on the CMP stopper film 12 was selectively removed to expose the surface of the CMP stopper film 12 as shown in FIG. 17, thereby leaving the silicon dioxide film 16 in the STI trench 13. As a result of these steps, it was possible to bury the silicon dioxide film 16 as an element isolating insulation film in the STI trench 13.

Figure 18:
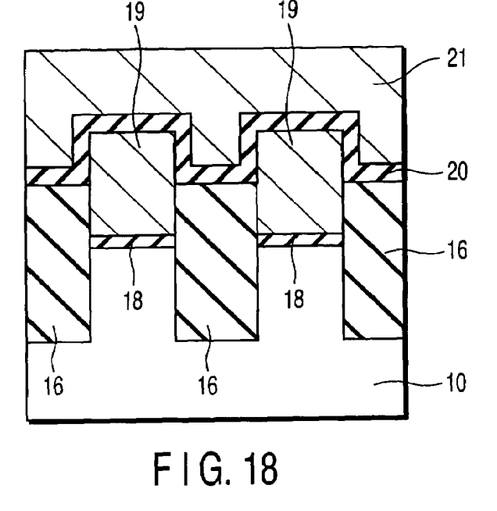
FIG. 18 is a cross-sectional view illustrating a step following the step shown in FIG. 17.

Subsequently, by etching using a solution of phosphoric acid, the CMP stopper film 12 was removed and by wet etching using a dilute solution of hydrofluoric acid, an upper portion of the silicon dioxide film 16 was removed. As a result of these procedures, part ranging about 100 nm of the upper portion of the side of the first gate electrode film 19 was exposed. Further, by the ordinary method, an inter-electrode insulation film 20 was deposited and then a second gate (controlling gate) electrode film 21 was formed on the inter-electrode insulation film 20, thereby fabricating a memory cell of a NAND structure as shown in FIG. 18. More specifically, the interelectrode insulation film 20 was formed by successively depositing a silicon oxide film/a silicon nitride film/a silicon oxide film to a thickness of about 20 nm by a vacuum CVD method, and the second gate electrode film 21 was formed by successively depositing a polycrystalline silicon film/a tungsten film to a thickness of about 50 nm by a vacuum CVD method.

According to this embodiment, since a silicon dioxide film was formed by using a polysilazane perhydride solution where dibutyl ether having a butanol impurity concentration of 30 ppm or less was employed as a solvent, the concentration of the carbon (C) remaining in this silicon dioxide film was reduced to $2\times10^{19}$ (cm$^{-3}$) or less.

As described above, since the silicon dioxide film 16 reduced in concentration of residual carbon in this manner was buried as an element isolating insulation film in the STI trench, it was possible, according to this embodiment, to manufacture a NAND device excellent in element isolation properties and reliability.

Embodiment 5

In the same manner as described in the aforementioned Embodiment 4, a silicon dioxide film 16 was formed on a Si substrate 10 having a gate insulation film 18, a first gate electrode film 19 and a CMP stopper film 12 formed thereon and also having an STI trench 13 formed thereon as shown in FIG. 16. These films were formed using the same materials as described in Embodiment 1, the film thickness of these films also being the same as described in Embodiment 1.

Figure 19:
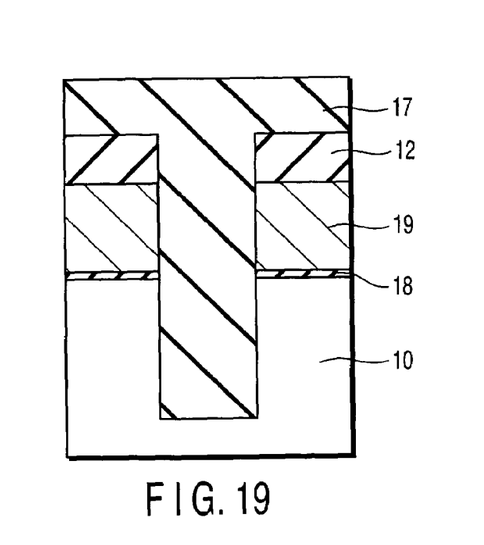
FIG. 19 shows a cross-sectional view illustrating a step in the manufacturing method of a semiconductor device according to a further embodiment of the present invention.
Figure 20:
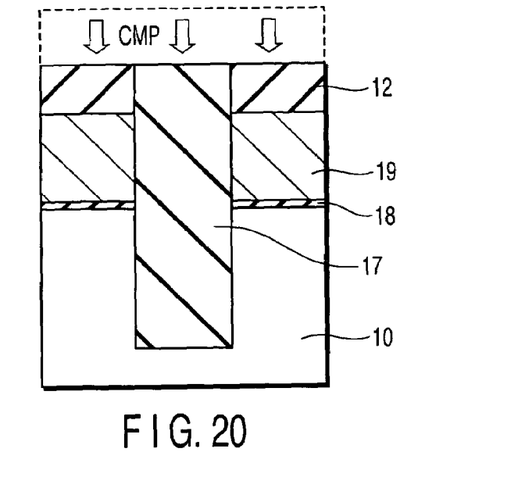
FIG. 20 is a cross-sectional view illustrating a step following the step shown in FIG. 19.
Figure 21:
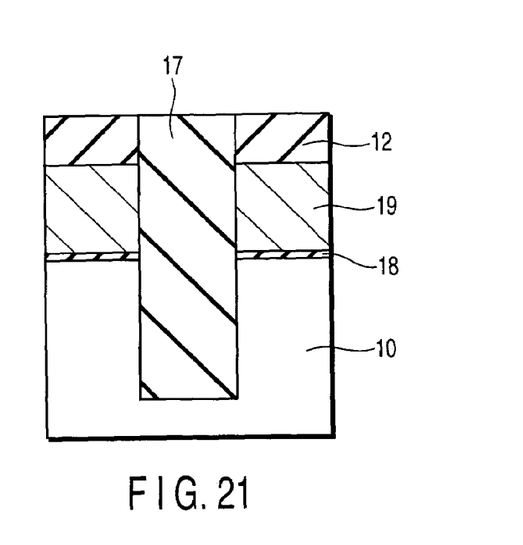
FIG. 21 is a cross-sectional view illustrating a step following the step shown in FIG. 20.

Then, under the same conditions as described in Embodiment 2, densify the silicon dioxide film 16 by heat treatment, thereby forming a densified silicon dioxide film 17 as shown in FIG. 19. Subsequently, by CMP, the densified silicon dioxide film 17 on the CMP stopper film 12 was selectively removed as shown in FIG. 20. The conditions of CMP were the same as described in Embodiment 2. In this manner, it was possible to leave the densified silicon dioxide film 17 in the STI trench 13 as shown in FIG. 21. Thereafter, by following the same procedures as described in Embodiment 4, a memory cell of a NAND structure as shown in FIG. 18 was fabricated. Incidentally, since the silicon dioxide film was densified in this embodiment, the element isolating insulation film was formed of a densified silicon dioxide film.

According to this embodiment, since a silicon dioxide film was formed by using a polysilazane perhydride solution where dibutyl ether having a butanol impurity concentration of 30 ppm or less was employed as a solvent, the concentration of the carbon (C) remaining in this silicon dioxide film was reduced to $2\times10^{19}$ (cm$^{-3}$) or less. Moreover, since the silicon dioxide film was densified, it was possible to advantageously suppress the wet etching rate.

As described above, since the densified silicon dioxide film 17 reduced in concentration of residual carbon in this manner was buried as an element isolating insulation film in the STI trench, it was possible, according to this embodiment, to manufacture a NAND device excellent in element isolation properties and reliability.

Embodiment 6

The densification of the silicon dioxide film 16 set forth in the above Embodiment 5 can be performed after the step of burying the silicon dioxide film 16 in the STI trench 13. In this embodiment, in the same manner as described in Embodiment 4, the silicon dioxide film 16 was buried in the STI trench 13 of the Si substrate 10 having a gate insulation film 18, a first gate electrode film 19 and a CMP stopper film 12 formed thereon as shown in FIG. 17. Since the silicon dioxide film 16 was subjected to CMP prior to the densification thereof, the absolute quantity of polysilazane perhydride film was smaller than that of Embodiment 5 and hence the quantity of residual carbon was also smaller as compared with that of Embodiment 5. As a result, it would be advantageous in the respect that the properties of device would be hardly degraded by the densification.

Then, the heat treatment was performed under the same conditions as in Embodiment 2 to densify the silicon dioxide film 16. As a result, it was possible to fill the STI trench 13 with the densified silicon dioxide film 17 as shown in FIG. 21. Thereafter, by following the same procedures as described in Embodiment 4, a memory cell of a NAND structure as shown in FIG. 18 was fabricated. Incidentally, since the silicon dioxide film was densified in this embodiment, the element isolating insulation film was formed of a densified silicon dioxide film.

According to this embodiment, since a silicon dioxide film was formed by using a polysilazane perhydride solution where dibutyl ether having a butanol impurity concentration of 30 ppm or less was employed as a solvent, the concentration of the carbon (C) remaining in this silicon dioxide film was reduced to $2\times10^{19}$ (cm$^{-3}$) or less. Moreover, since the silicon dioxide film was densified, it was possible to advantageously suppress the wet etching rate.

As described above, since the densified silicon dioxide film 17 reduced in concentration of residual carbon in this manner was buried as an element isolating insulation film in the STI trench, it was possible, according to this embodiment, to manufacture a NAND device excellent in element isolation properties and reliability.

According to the embodiments of the present invention, it is possible to provide a method of manufacturing a semiconductor device which is excellent in element isolation properties and also to provide a polysilazane perhydride solution to be employed in the manufacture of a semiconductor device.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A method of manufacturing a semiconductor device comprising:
   forming an element isolation trench in a semiconductor substrate;
   coating a polysilazane perhydride solution on the semiconductor substrate having the element isolation trench to form a polysilazane perhydride film, the polysilazane perhydride solution comprising dibutyl ether having a butanol concentration of 30 ppm or less, and polysilazane perhydride dissolved in the dibutyl ether;
   subjecting the polysilazane perhydride film to oxidation in an atmosphere containing water vapor to form a silicon dioxide film; and
   selectively removing the silicon dioxide film to leave the silicon dioxide film in the element isolation trench, thereby forming an element isolating insulation film.

2. The method according to claim 1, wherein the oxidation of the polysilazane perhydride film is performed at a temperature ranging from 230° C. to 900° C.

3. The method according to claim 1, wherein the oxidation of the polysilazane perhydride film is performed for a period ranging from 5 minutes to 60 minutes.

4. The method according to claim 1, further comprising densifying the silicon dioxide film prior to selectively removing the silicon dioxide film.

5. The method according to claim 4, wherein densifying the silicon dioxide film is performed through a heat treatment at a temperature ranging from 700° C. to 1100° C.

6. The method according to claim 1, further comprising densifying the silicon dioxide film that has been left in the element isolation trench of the semiconductor substrate.

7. The method according to claim 6, wherein densifying the silicon dioxide film is performed through a heat treatment at a temperature ranging from 700° C. to 1100° C.

8. The method according to claim 1, wherein the element isolation trench has a width ranging from 30 nm to 10 μm.

9. The method according to claim 1, wherein a concentration of carbon in the silicon dioxide film is $2 \times 10^{19}$ cm$^{-3}$ or less.

10. A method of manufacturing a semiconductor device comprising:
    successively forming a gate insulating film, a first gate electrode film and a stopper film above a semiconductor substrate;
    forming an element isolation trench in the semiconductor substrate having the gate insulating film, the first gate electrode film and the stopper film;
    coating a polysilazane perhydride solution above the semiconductor substrate having the element isolation trench to form a polysilazane perhydride film, the polysilazane perhydride solution comprising dibutyl ether having a butanol concentration of 30 ppm or less, and polysilazane perhydride dissolved in the dibutyl ether;
    subjecting the polysilazane perhydride film to oxidation in an atmosphere containing water vapor to form a silicon dioxide film;
    selectively removing the silicon dioxide film deposited on the stopper film to leave the silicon dioxide film in the element isolation trench, thereby forming an element isolating insulation film;
    removing the stopper film to expose a surface of the first gate electrode film;
    removing an upper portion of the element isolating insulation film to expose an upper portion of side of the first gate electrode film; and
    forming a second gate electrode film, via an interelectrode insulating film, over the first gate electrode film having an upper portion of side thereof being exposed and over the element isolating insulation film having an upper portion thereof being removed.

11. The method according to claim 10, wherein the oxidation of the polysilazane perhydride film is performed at a temperature ranging from 230° C. to 900° C.

12. The method according to claim 10, wherein the oxidation of the polysilazane perhydride film is performed for a period ranging from 5 minutes to 60 minutes.

13. The method according to claim 10, further comprising densifying the silicon dioxide film prior to selectively removing the silicon dioxide film.

14. The method according to claim 13, wherein the densification of the silicon dioxide film is performed through a heat treatment at a temperature ranging from 700° C. to 1100° C.

15. The method according to claim 10, further comprising densifying the silicon dioxide film that has been left in the element isolation trench of the semiconductor substrate.

16. The method according to claim 15, wherein the densification of the silicon dioxide film is performed through a heat treatment at a temperature ranging from 700° C. to 1100° C.

17. The method according to claim 10, wherein the element isolation trench has a width ranging from 30 nm to 10 μm.

18. The method according to claim 10, wherein the element isolation trench has a depth ranging from 200 nm to 500 nm.

19. The method according to claim 10, wherein a concentration of carbon in the silicon dioxide film is $2 \times 10^{19}$ cm$^{-3}$ or less.

* * * * *